(12) United States Patent
Sheppard et al.

(10) Patent No.: US 9,318,594 B2
(45) Date of Patent: Apr. 19, 2016

(54) SEMICONDUCTOR DEVICES INCLUDING IMPLANTED REGIONS AND PROTECTIVE LAYERS

(75) Inventors: Scott T. Sheppard, Chapel Hill, NC (US); Adam Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 367 days.

(21) Appl. No.: 12/186,106

(22) Filed: Aug. 5, 2008

(65) Prior Publication Data

US 2008/0290371 A1    Nov. 27, 2008

Related U.S. Application Data

(62) Division of application No. 11/302,062, filed on Dec. 13, 2005, now Pat. No. 7,419,892.

(51) Int. Cl.
| | |
|---|---|
| H01L 21/338 | (2006.01) |
| H01L 29/778 | (2006.01) |
| H01L 21/04 | (2006.01) |
| H01L 21/265 | (2006.01) |
| H01L 29/66 | (2006.01) |
| H01L 29/16 | (2006.01) |
| H01L 29/20 | (2006.01) |

(52) U.S. Cl.
CPC .......... *H01L 29/7787* (2013.01); *H01L 21/046* (2013.01); *H01L 21/26553* (2013.01); *H01L 29/66068* (2013.01); *H01L 29/66462* (2013.01); *H01L 29/1608* (2013.01); *H01L 29/2003* (2013.01)

(58) Field of Classification Search
CPC ................ H01L 21/26553; H01L 29/66462
USPC ............... 257/192, 194, E29.242, E29.246, 257/E21.407, 167, 172
See application file for complete search history.

(56) References Cited

U.S. PATENT DOCUMENTS

| | | | | |
|---|---|---|---|---|
| 3,891,468 | A | * | 6/1975 | Ito .......................... H01L 21/00 148/DIG. 157 |
| 4,028,717 | A | * | 6/1977 | Joy ..................... H01L 29/7836 148/DIG. 53 |
| 4,111,720 | A | * | 9/1978 | Michel et al. ................. 438/334 |
| 4,369,072 | A | * | 1/1983 | Bakeman, Jr. ...... H01L 21/2652 257/404 |
| 4,396,437 | A | * | 8/1983 | Kwok ................. H01L 21/3245 257/E21.326 |
| 4,426,765 | A | * | 1/1984 | Shahriary ......... H01L 21/28575 257/E21.172 |
| 4,519,127 | A | * | 5/1985 | Arai .................. H01L 21/26546 257/279 |

(Continued)

FOREIGN PATENT DOCUMENTS

| | | |
|---|---|---|
| EP | 0 287 769 A1 | 10/1988 |
| JP | S61-203683 A | 9/1986 |

(Continued)

OTHER PUBLICATIONS

R. G. Wilson et al, "Thermal stability of implanted dopants in GaN", Applied Physics Letters 66 (1995) pp. 2238-2240.*

(Continued)

*Primary Examiner* — Jay C Kim
(74) *Attorney, Agent, or Firm* — Myers Bigel & Sibley, P.A.

(57) ABSTRACT

A semiconductor structure includes a Group III-nitride semiconductor layer, a protective layer on the semiconductor layer, a distribution of implanted dopants within the semiconductor layer, and an ohmic contact extending through the protective layer to the semiconductor layer.

26 Claims, 4 Drawing Sheets

(56) References Cited

U.S. PATENT DOCUMENTS

| | | | |
|---|---|---|---|
| 4,642,879 A * | 2/1987 | Kawata | H01L 21/265 148/DIG. 140 |
| 4,772,489 A * | 9/1988 | Shikata | H01L 21/0217 257/E21.269 |
| 4,863,879 A | 9/1989 | Kwok | |
| 4,946,547 A | 8/1990 | Palmour et al. | |
| 5,192,987 A | 3/1993 | Khan et al. | |
| 5,200,022 A | 4/1993 | Kong et al. | |
| 5,204,278 A | 4/1993 | Imamura et al. | |
| 5,210,051 A | 5/1993 | Carter, Jr. | |
| 5,292,501 A | 3/1994 | Degenhardt et al. | |
| 5,296,394 A * | 3/1994 | Shim | H01L 21/2258 257/E21.152 |
| 5,296,395 A | 3/1994 | Khan et al. | |
| 5,306,662 A | 4/1994 | Nakamura et al. | |
| RE34,861 E | 2/1995 | Davis et al. | |
| 5,393,993 A | 2/1995 | Edmond et al. | |
| 5,523,589 A | 6/1996 | Edmond et al. | |
| 6,174,794 B1 | 1/2001 | Gardner et al. | |
| 6,218,680 B1 | 4/2001 | Carter, Jr. et al. | |
| 6,316,793 B1 | 11/2001 | Sheppard et al. | |
| 6,495,409 B1 * | 12/2002 | Manfra et al. | 438/216 |
| 6,498,111 B1 | 12/2002 | Kapolnek et al. | |
| 6,528,405 B1 * | 3/2003 | Martinez et al. | 438/602 |
| 6,686,616 B1 * | 2/2004 | Allen et al. | 257/280 |
| 6,735,492 B2 | 5/2004 | Saxler et al. | |
| 6,849,882 B2 | 2/2005 | Chavarkar et al. | |
| 6,861,666 B1 | 3/2005 | Weiner et al. | |
| 6,982,204 B2 | 1/2006 | Saxler et al. | |
| 7,030,428 B2 | 4/2006 | Saxler et al. | |
| 7,064,359 B2 * | 6/2006 | Ishida | H01L 29/7787 257/11 |
| 2001/0015437 A1 * | 8/2001 | Ishii et al. | 257/12 |
| 2002/0066908 A1 | 6/2002 | Smith | |
| 2002/0167023 A1 | 11/2002 | Chavarkar et al. | |
| 2003/0020092 A1 | 1/2003 | Parikh et al. | |
| 2003/0102482 A1 | 6/2003 | Saxler | |
| 2004/0061129 A1 | 4/2004 | Saxler et al. | |
| 2004/0079965 A1 | 4/2004 | Tamura et al. | |
| 2004/0149993 A1 | 8/2004 | McClure et al. | |
| 2005/0087763 A1 * | 4/2005 | Kanda | H01L 27/14609 257/192 |
| 2005/0142875 A1 | 6/2005 | Yoo | |
| 2006/0226442 A1 * | 10/2006 | Zhang et al. | 257/192 |
| 2006/0292800 A1 | 12/2006 | Shih et al. | |

FOREIGN PATENT DOCUMENTS

| | | |
|---|---|---|
| JP | S64-57680 A | 3/1989 |
| JP | 06-021100 | 1/1994 |
| JP | H11-97452 A | 4/1999 |
| JP | H11-297713 A | 10/1999 |
| JP | 2000-235984 A | 8/2000 |
| JP | 2003-197642 A | 7/2003 |
| JP | 2003-257999 A | 9/2003 |
| JP | 2004-289041 A | 10/2004 |
| JP | 2006-222160 A | 8/2006 |

OTHER PUBLICATIONS

S. J. Chang et al., "Be diffusion in GaN", Materials Characterization 49 (2003) pp. 337-341.*

Khan et al., "AlGaN/GaN metal-oxide-semiconductor heterostructure field-effect transistors on SiC substrates", Applied Physics Letters 77 (2000) pp. 1339-1341.*

Cai et al., "High-Performance Enhancement-Mode AlGaN/GaN HEMTs Using Fluoride-Based Plasma Treatment", IEEE Electron Device Letters 26 (2005) pp. 435-437.*

Nomoto et al., "Remarkable Reduction of On-Resistance by Ion Implantation in GaN/AlGaN/GaN HEMTs With Low Gate Leakage Current", IEEE Electron Device Letters 28 (2007) pp. 939-941.*

Pearton et al., "Fabrication and performance of GaN electronic devices", Materials Science and Engineering R30 (2000) pp. 55-212.*

Pearton et al., "GaN: Processing, defects, and devices", Journal of Applied Physics 86 (1999) pp. 1-78.*

John A. Archer et al., "A GaAs Monolithic Low-Noise Broad-Band Amplifier", IEEE Journal of Solid-State Circuits, sc-16:6, pp. 648-652 (Dec. 1981); XP-000819507.

S. Denbaars et al., "Ion Implanted AlGan-GaN HEMTs With Nonalloyed Ohmic Contacts", IEEE Electron Device Letters, 26:5, pp. 283-285 (May 2005); XP011131276.

Takatomo Enoki et al., "Characteristics Including Electron Velocity Overshoot for 0.1-μm-Gate-Length GaAs SAINT MESFET's", IEEE Transactions on Electron Devices, 37:4, pp. 935-941 (Apr. 1990); XP000125204.

Yoshihiro Saito et al., "Effect of Silicon Nitride Cap on the Activation of Implanted Silicon in Gallium Arsenide", Japanese Journal of Applied Physics, 42:8,1; pp. 4924-4927 (Aug. 2003); XP-001191418.

European Search Report and European Search Opinion (9 pages) corresponding to European Application No. 06126051.9; Mailing Date: Nov. 10, 2008.

Coates et al. "Deposition of Silicon Nitride to Improve the Conversion Efficiency of Multicrystalline Silicon Solar Cells" *Proceedings of the 16th European Photovoltaic Solar Energy Conference,* Glasgow pp. 1279-1281 (2000).

Yu et al. "Schottky Barrier Engineering in III-V Nitrides via the Piezoelectric Effect" *Applied Physics Letters* 73(13): (1998).

Fellows et al. "Electrical activation studies of GaN implanted with Si from low to high dose" *Applied Physics Letters* vol. 80, No. 11: 1930-1932 Mar. 18, 2002.

Irokawa et al. "Activation characteristics of ion-implanted Si$^+$ in AlGaN" *Applied Physics Letters* 86:192102-1-192102-3 (2005).

Kucheyev et al. "Ion implantation into GaN" Reports: A Review Journal *Materials Science and Engineering,* 33: 51-107 (2001).

Matsunaga et al. "Silicon implantation in epitaxial GaN layers: Encapsulant annealing and electrical properties." *Journal of Applied Physics* vol. 95, No. 5: 2461-2466 Mar. 1, 2004.

Qiao et al. Low resistance ohmic contacts on AlGaN/GaN structures using implantation and the "advancing" Al/Ti metallization *Applied Physics Letters* vol. 74, No. 18:2652-2654 May 3, 1999.

Recht et al. "Nonalloyed Ohmic Contacts in AlGaN/GaN HEMTs by Ion Implantation With Reduced Activation Annealing Temperature" IEEE Electron Device Letters, vol. 27, No. 4: 205-207 Apr. 4, 2006.

Ryu et al. "High electrical activation efficiency obtained from Si-implanted Al$_{0.18}$Ga$_{0.82}$N" *Journal of Applied Physics* vol. 96, No. 11: 6277-6280 Dec. 1, 2004.

Yu et al. "Dopant activation and ultralow resistance ohmic contacts to Si-ion-implanted GaN using pressurized rapid thermal annealing" *Applied Physics Letters,* vol. 85, No. 22: 5254-5256 Nov. 29, 2004.

Mayer et al., Electronic Materials Science: for Integrated Circuits in Si and GaAs, Macmillan Publishing Company, p. 269.

S. Porowski et al., "Annealing of gallium nitride under high N$_2$ pressure," Physica B 265 (1999) pp. 295-299.

Japanese Office Action Corresponding to Japanese Patent Application No. 2006-335975; Mailing Date: Dec. 2, 2011; 8 pages.

Japanese Office Action Corresponding to Japanese Patent Application No. 2013-103911; Mailing Date: Aug. 26, 2014; Foreign Text, 2 Pages, English Translation Thereof, 2 Pages.

* cited by examiner

SEMICONDUCTOR DEVICES INCLUDING IMPLANTED REGIONS AND PROTECTIVE LAYERS

RELATED APPLICATION

This application is a divisional of and claims priority to U.S. patent application Ser. No. 11/302,062, filed on Dec. 13, 2005 now U.S. Pat. No. 7,419,892, the disclosure of which is hereby incorporated herein by reference in its entirety as set forth fully herein.

FIELD OF THE INVENTION

The present invention relates to semiconductor devices and, more particularly, to semiconductor devices that include implanted regions and related methods.

BACKGROUND

There is a high level of interest in wide bandgap semiconductor materials such as silicon carbide (2.996 eV for alpha SiC at room temperature) and the Group III nitrides (e.g., 3.36 eV for GaN at room temperature) for high power, high temperature and/or high frequency applications. These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. In addition, a major portion of the electrons in the 2DEG is attributed to polarization in the AlGaN.

HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

In order to provide desired semiconductor properties, it is frequently desirable to dope a semiconductor layer with impurity atoms (i.e. dopants). Doping of semiconductor materials may be performed during and/or after material growth. Impurity atoms may be categorized as n-type or p-type depending on whether the implanted ions act as donors (which increase the number of electrons) or acceptors (which increase the number of holes), respectively, in the doped material. The resulting material may be characterized as n-type or p-type depending on the predominant type of dopants in the material.

Ion implantation is a well-known method of doping a semiconductor layer with impurities. In an ion implantation process, ionized impurity atoms are accelerated under high vacuum through an electric field towards a target layer, where they become implanted. The number of ions directed at a target layer is referred to as the dose, which is typically expressed in ions/cm$^2$. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. The implanted ions typically form a concentration distribution that has a peak concentration at a particular depth (i.e., the "implant range").

Ion implantation is useful for selective doping of crystalline material in order to form desired regions in the material, such as p-n junctions, highly conductive contact regions, field spreading regions, etc. Typically, after impurities are implanted into a semiconductor layer, it is desirable to anneal the implanted impurities at a high temperature, i.e. a so-called activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors.

For some semiconductor materials, the temperature at which appreciable lattice damage repair may occur is above the temperature at which the material will dissociate at normal ambient pressures. For that reason, it is known to provide a stable capping layer on an implanted semiconductor layer during the activation anneal. The material of the capping layer is therefore preferably stable at high temperatures. Removal of such a capping layer may be problematic after the implanted layer is annealed, however.

SUMMARY OF THE INVENTION

A method of forming a semiconductor device according to some embodiments of the invention includes forming a protective layer on a semiconductor layer, implanting ions having a first conductivity type through the protective layer into the semiconductor layer to form an implanted region of the semiconductor layer, annealing the semiconductor layer and the protective layer to activate the implanted ions, forming an opening in the protective layer to expose the implanted region of the semiconductor layer, and forming an electrode in the opening. The implanted ions may include Si, S or O, and the electrode may include a source or drain contact.

The semiconductor layer may include a Group III-nitride material and/or SiC. The semiconductor layer may further include an epitaxial layer.

The epitaxial layer may be formed in a reaction chamber, and the protective layer may be formed in the same reaction chamber as the semiconductor layer. The protective layer may include SiN, $SiO_2$ and/or SiON.

The protective layer may be formed by MOCVD and/or LPCVD at a temperature greater than 700° C., and may include stoichiometric SiN.

Annealing the semiconductor layer and the protective layer may include annealing in an inert gas.

The protective layer may include SiN, and annealing the semiconductor layer and the protective layer may include annealing in an atmosphere containing $NH_3$.

Annealing the semiconductor layer and the protective layer may include annealing at a temperature of about 1000° C. or greater. In particular embodiments, annealing the semiconductor layer and the protective layer may include annealing at a temperature of from about 1000° C. to about 1300° C. Annealing the semiconductor layer and the protective layer may include annealing at a temperature sufficient to activate the implanted ions but less than a temperature at which the semiconductor layer deteriorates.

Annealing the semiconductor layer and the protective layer may include annealing in $NH_3$ and $SiH_4$ so that SiN may be formed during the anneal.

The implant dose may be selected to provide a peak implant concentration near an interface of the semiconductor layer and the protective layer. The implant dose may be about $4 \times 10^{14}$ ions/cm$^2$ or greater. In some embodiments, the implant dose may be greater than about $2 \times 10^{15}$ ions/cm$^2$. The peak implant concentration may be greater than about $1 \times 10^{20}$ cm$^{-3}$. In some cases, the peak implant concentration may be greater than about $3 \times 10^{20}$ cm$^{-3}$.

Forming an opening in the protective layer may include forming a first opening in the protective layer, and forming an electrode in the opening may include forming a source/drain electrode in the first opening. The method may further include forming a second opening in the protective layer to expose a non-implanted region of the semiconductor layer, and forming a gate electrode in the second opening.

Forming the gate electrode and forming the source/drain electrode may be performed in the same metallization process.

A semiconductor structure according to some embodiments of the invention includes a Group III-nitride semiconductor layer, a protective layer on the semiconductor layer, a distribution of implanted dopants within the semiconductor layer, and an ohmic contact extending through the protective layer to the semiconductor layer.

The protective layer may include SiN, $SiO_2$ and/or SiON. In particular, the protective layer may include stoichiometric SiN. The implanted dopants may include Si, S and/or O atoms.

The distribution of implanted dopants may have a peak concentration near an interface of the semiconductor layer and the protective layer. Moreover, the distribution of implanted dopants may have a peak concentration beneath an interface of the semiconductor layer and the protective layer. The distribution of implanted dopants may extend through the semiconductor layer and into a layer beneath the semiconductor layer.

The ohmic contact may be in direct contact with the protective layer.

A semiconductor structure according to some embodiments of the invention may further include a non-ohmic metal contact extending through the protective layer to the semiconductor layer. The non-ohmic metal contact may include the same material as the ohmic contact or a different material.

A transistor device according to some embodiments of the invention includes a Group III-nitride semiconductor layer including source and drain regions, a SiN protective layer on the semiconductor layer, a distribution of implanted dopants within the source and drain regions of the semiconductor layer, and source and drain ohmic contacts extending through the protective layer to the source and drain regions, respectively, of the semiconductor layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
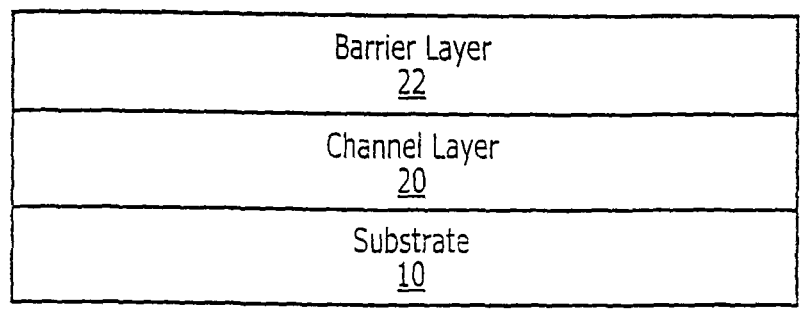
FIGS. 1A-1F are cross-sectional views illustrating fabrication of a transistor according to embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. It will also be appreciated by those of skill in the art that references to a structure or feature that is disposed "adjacent" another feature may have portions that overlap or underlie the adjacent feature.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures for GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," United States Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER" and U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," the disclosures of which are hereby incorporated herein by reference in their entirety.

However, while embodiments of the present invention are described in connection with GaN HEMT devices, the present invention may be employed in connection with other types of devices and/or materials. For example, embodiments of the invention may also be particularly suited for use in silicon carbide MESFET devices, such as the devices described in U.S. Pat. No. 6,686,616 entitled "SILICON CARBIDE METAL-SEMICONDUCTOR FIELD EFFECT TRANSISTORS" the disclosure of which is hereby incorporated herein by reference in their entirety. Likewise, some embodiments of the invention may be advantageously employed in GaN-based light emitting devices (LEDs), as well as in GaAs-based devices such as GaAs/AlGaAs pHEMT devices.

Embodiments of the present invention utilize a protective layer during implantation of dopant atoms into a semiconductor layer, for example, to provide highly doped source/drain regions of a transistor. The protective layer may remain on the structure during an anneal to activate the implanted dopant atoms to protect the surface of the semiconductor layer. The protective layer may further remain on the semiconductor layer to act as a passivation layer for the semiconductor layer in the completed device.

Fabrication of structures according to embodiments of the present invention is schematically illustrated in FIGS. 1A-1F. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used in a relative rather than absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned United States Patent Publication 2003/0102482A1 entitled "STRAIN BALANCED NITRIDE HETEROJUNCTION TRANSISTORS AND METHODS OF FABRICATING STRAIN BALANCED NITRIDE HETEROJUNCTION TRANSISTORS, and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the disclosures of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the disclosures of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HVPE.

In some embodiments of the present invention, the channel layer 20 is a Group III-nitride, such as $Al_xGa_{1-x}N$ where $0 \leq x \leq 1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is provided on the channel layer 20. The channel layer 20 may have a bandgap that is less than the bandgap of the barrier layer 22 and the channel layer 20 may also have a larger electron affinity than the barrier layer 22. The barrier layer 22 may be deposited on the channel layer 20. In certain embodiments of the present invention, the barrier layer 22 is AlN, AlInN, AlGaN or AlInGaN with a thickness of between about 0.1 nm and about 10 nm. Examples of layers according to certain embodiments of the present invention are described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer 22 is thick enough and has a high enough Al composition and doping to induce a significant carrier concentration at the interface between the channel layer 20 and the barrier layer 22 through polarization effects when the barrier layer 22 is buried under ohmic contact metal. Also, the barrier layer 22 should be thick enough to reduce or minimize scattering of electrons in the channel due to ionized impurities deposited at the interface between the barrier layer 22 and a protective 24 (FIG. 1B).

As noted above, the barrier layer 22 may have a bandgap larger than that of the channel layer 20 and a smaller electron affinity than the channel layer 20. Accordingly, in certain embodiments of the present invention, the barrier layer 22 may include AlGaN, AlInGaN and/or AlN or combinations of layers thereof. The barrier layer 22 may, for example, be from about 0.1 μm to about 10 nm thick, but should not be so thick as to cause cracking or substantial defect formation therein. In certain embodiments of the present invention, the barrier layer 22 is undoped or doped with an n-type dopant to a concentration less than about $1 \times 10^{19}$ cm$^{-3}$. In some embodiments of the present invention, the barrier layer 22 is $Al_xGa_{1-x}N$ where $0 \leq x \leq 1$. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%.

Figure 1B:
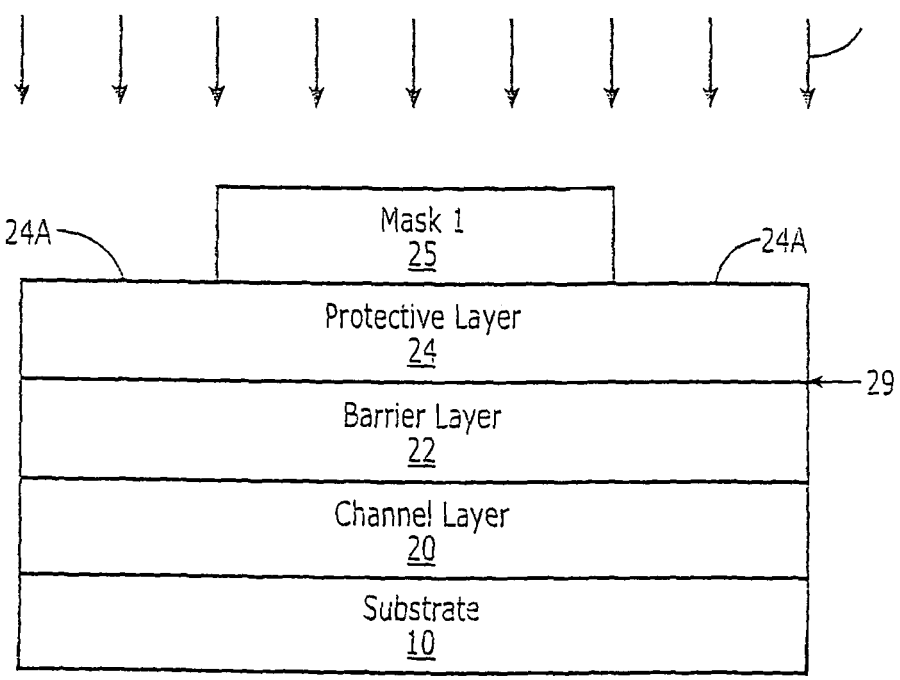

As shown in FIG. 1B, a protective layer 24 is formed on the barrier layer 22. The protective layer 24 may be silicon nitride ($Si_xN_y$), silicon dioxide ($SiO_2$) and/or another suitable protective material, such as silicon oxynitride (SiON). It will be understood that the terms "$Si_xN_y$," "SiN" and "silicon nitride" are used herein interchangeably to refer to both stoichiometric and non-stoichiometric silicon nitride. Other materials may also be utilized for the protective layer 24. For example, the protective layer 24 could also include magnesium oxide, scandium oxide, aluminum oxide and/or aluminum oxynitride. Furthermore, the protective layer 24 may be a single layer or multiple layers of uniform and/or non-uniform composition. The material of the protective layer 24 should have appropriate interface characteristics, should be capable of withstanding relatively high temperatures, and should be capable of being removed without significantly damaging the underlying barrier layer 22.

In general, the protective layer 24 may be a dielectric layer that has a relatively high breakdown field strength and that provides a relatively low interface trap density at the interface with an underlying Group III-nitride layer such as the barrier layer 22. The protective layer 24 may have a high etch selectivity with respect to the material of the barrier layer 22, and may not be reactive to the material of the barrier layer 22. Moreover, the protective layer 24 may have a relatively low level of impurities therein. For example, the protective layer 24 may have a relatively low level of hydrogen and other impurities, including oxygen, carbon, fluorine and chlorine. In addition, the protective layer 24 may be stable at relatively high temperatures (e.g. >1000° C.) in order to withstand high annealing temperatures used in subsequent process steps.

In particular embodiments of the present invention, the protective layer 24 is SiN. The SiN may be formed for example by Low Pressure Chemical Vapor Deposition (LPCVD) and/or Metal-Organic Chemical Vapor Deposition (MOCVD). The SiN layer may be stoichiometric (i.e. the ratio of silicon to nitrogen in the material is about 3:4). The stoichiometry of a SiN layer may be adjusted, for example, by adjusting the relative flow rates of $SiH_4$ and $NH_3$ source gases in a CVD process. Moreover, when formed at relatively high temperatures, CVD-grown SiN tends to be stoichiometric.

The stoichiometry of a SiN layer may also affect the index of refraction of the layer. In certain embodiments of the present invention, a SiN protective layer 24 may have an index of refraction at a 633 nm wavelength of from about 1.6 to about 2.2. In particular embodiments, the index of refraction of a SiN protective layer 24 is 1.98±0.05 as measured by ellipsometry. Stoichiometric SiN may also be characterized by its etch rate in a buffered oxide etch (BOE). For example, the etch rate of stoichiometric SiN in BOE is nearly zero.

In some embodiments, the protective layer 24 may be $SiO_2$. The $SiO_2$ may be formed by LPCVD and/or MOCVD and may be stoichiometric. In certain embodiments of the present invention, an $SiO_2$ protective layer may have an index of refraction at a 633 nm wavelength of from about 1.36 to about 1.56. In particular embodiments, the index of refraction of an SiO$_2$ protective layer is 1.46±0.03 as measured by ellipsometry.

When the protective layer 24 includes silicon nitride, the protective layer 24 should have impurity levels at or below the levels shown in Table 1, as measured by secondary ion mass spectroscopy (SIMS) with a Cs ion beam.

TABLE 1

| Element | Concentration (cm$^{-3}$) |
|---|---|
| H | 4 × 10$^{21}$ |
| O | 3 × 10$^{18}$ |
| C | 7 × 10$^{7}$ |
| F | 1 × 10$^{16}$ |
| CL | 4 × 10$^{16}$ |

The protective layer 24 may be blanket formed on the barrier layer 22. Typically, the protective layer 24 may have a thickness in the range of about 100 nm, however, other thickness layers may also be utilized. For example, the protective layer should be sufficiently thick so as to protect the underlying layer during a subsequent anneal of ohmic contacts. Layers as thin as two or three monolayers may be sufficient for such purposes. However, in general, the protective layer 24 may have a thickness of from about 10 nm to about 500 nm.

The protective layer may comprise a high purity SiN layer as described in U.S. patent application Ser. No. 11/286,805 entitled "GROUP III NITRIDE SEMICONDUCTOR DEVICES WITH SILICON NITRIDE LAYERS AND METHODS OF MANUFACTURING SUCH DEVICES" filed Nov. 23, 2005, the disclosure of which is incorporated herein by reference as if fully set forth herein. In particular, pursuant to certain embodiments of the present invention, an in situ grown SiN protective layer 24 may be grown at relatively high temperatures (e.g., above about 700° C.). In particular embodiments, the SiN layers may be grown at a temperature in the range of about 900-1000° C. Such high temperature growth may also facilitate reducing the impurity levels in the SiN layer and at the interface between a Group III nitride layer and the SiN layer. Additionally, high growth rates may be employed which may facilitate reducing the levels of background reactor impurities incorporated into the SiN layer. For example, in certain embodiments of the present invention, the SiN layer(s) may be grown at a growth rate of at least about 0.2 microns/hour. In certain specific embodiments, the growth rate may be about 2 microns/hour.

Forming the SiN layer in situ may also reduce the levels of impurities that are incorporated into the top surface of the uppermost Group III nitride layer and/or into the SiN layer itself. In particular, when the device is removed from the reactor and the SiN layer is formed via a post-MOCVD growth process such as, for example, sputtering or PECVD, a number of different mechanisms may introduce impurities. For example, as discussed in detail in U.S. Pat. No. 6,498,111, if hydrogen is present in an MOCVD reactor during the growth of a Group III nitride layer, the hydrogen may tend to incorporate into the Group III nitride layer during cooling of the reactor following growth. Likewise, exposure of the device to the atmosphere upon removal from the reactor may allow for incorporation of oxygen atoms, and various other impurities may be introduced, particularly adjacent the outer surfaces of the device, as a result of handling of the device and/or chemical cleaning of the device. Impurities may also be added if post-growth processing such as wet etching, electrode deposition, annealing steps, etc. are performed prior to deposition of the SiN protective/passivation layer. These impurities may change the surface states at the interface between the Group III nitride layer and the SiN layer in ways that may be undesirable and/or difficult to control/reproduce. For example, the presence of impurities can increase trapping at the interface between the SiN layer and the underlying Group III nitride layer, thereby increasing the sheet resistance of the channel.

In certain embodiments of the present invention, high purity silane (SiH$_4$) may be used as a source gas in the growth of the SiN layer(s). As is known to persons of skill in the art, silane is often used as a source for silicon dopants in the growth of n-doped Group III nitride layers. Typically, diluted silane gas is used in such applications as it is less expensive and easier to use than pure silane, which may be highly combustible. The use of such pure silane may facilitate reducing the level of impurities at, for example, the interface between the Group III nitride layer and the SiN layer and/or within the SiN layer, which may, in certain circumstances, improve the performance and/or reproducibility of the device. In particular, the higher quality (i.e., more pure) SiN layer may help reduce or minimize trapping within the body of the insulative layer, thereby providing a higher breakdown critical field. When such a pure silane gas source is included with the reactor, it may still be desirable to include a diluted silane source as well, so that diluted silane gas may be used as the dopant gas source during the growth of, for example, an n-doped or co-doped Group III nitride layer.

Referring still to FIG. 1B, a mask 25 is formed on the protective layer 24. The mask 25 may include photoresist or any other suitable mask material such as SiN and/or SiO$_2$. The mask may have a thickness selected to block implanted ions. For example, when the protective layer comprises SiN, the mask 25 may include an oxide such as SiO$_2$, and vice-versa.

Figure 1C:
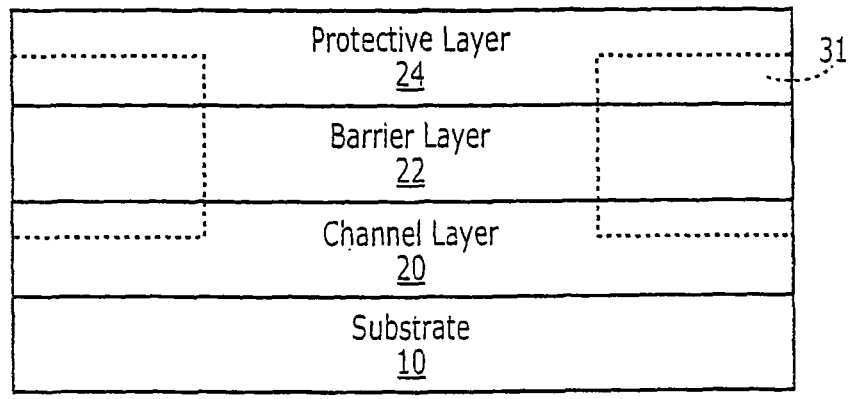

Windows are opened in the mask 25 to expose surface portions 24A of the protective layer 24, and impurity ions 27 are implanted through the windows into the protective layer 24 such that at least a portion of the implanted ions come to rest within the barrier layer 22. In addition, some of the implanted ions may come to rest within the channel layer 20. In some cases, the implanted ions form a concentration profile having a peak near the interface 29 between the protective layer 24 and the barrier layer 22. However, the implant peak may be placed away from (i.e. above or below) the interface 29 between the protective layer 24 and the barrier layer 22. Accordingly, as shown in FIG. 1C, an implanted region 31 may be formed partially within the protective layer 24, the barrier layer 22 and/or the channel layer 20.

The implant conditions may be selected to provide an implanted region 31 having a peak dopant concentration of 1×10$^{18}$ cm$^{-3}$ or greater. For example, in some embodiments, the dose and energy of the implants may be selected to provide a peak dopant concentration of about 5×10$^{19}$ cm$^{-3}$. The implant process may include multiple implant steps to provide a net profile of implanted dopants. For example, the implant process may include a first implant step performed under a first set of implant conditions and a subsequent implant step performed under a second set of implant conditions. More than two implant steps may be performed.

In some embodiments, the implants may be performed at room temperature. The implant energies and dose may be selected to provide an implant profile that achieves a desired sheet resistivity and/or permits fabrication of low resistivity ohmic contacts to the barrier layer 22 as provided below. In order to form n-type implanted regions 31 in a nitride-based layer, the implanted ions may include silicon, sulfur and/or oxygen ions.

After formation of the implanted regions 31, the implants may be activated by an activation anneal. The mask 25 may be removed prior to the implant activation anneal, for example by means of a photoresist strip and/or an etch process. However, the activation anneal may be performed with the protective layer 24 in place. In particular, the protective layer 24 may protect the surface of the barrier layer 22 during the anneal.

The activation anneal may be performed in an inert atmosphere including, for example, $N_2$ and/or Ar. When the protective layer 24 includes SiN, the anneal atmosphere may include a partial pressure of $NH_3$ in the range of about 0.1 mbar to 1000 mbar. More particularly, the $NH_3$ may have a pressure of about 10-100 mbar. In particular, the $NH_3$ may have a pressure of about 90 mbar. The $NH_3$ may help to reduce decomposition of the SiN protective layer 24. The activation anneal may be performed at a temperature sufficient to activate the implanted dopant ions but less than a temperature at which the underlying semiconductor layer, i.e. the barrier layer 22, deteriorates. The presence of the protective layer 24 during the high temperature process steps may inhibit damage to the underlying epitaxial layers, including barrier layer 22, that may otherwise result from high temperature annealing. For example, where the barrier layer 22 includes AlGaN, the activation anneal may be performed at a temperature greater than 1000° C.

In some embodiments, $SiH_4$ may be provided during the implant anneal along with $NH_3$, in which case, SiN may be deposited on the protective layer during the anneal.

In some embodiments, the activation anneal may be performed at a temperature of about 1000° C. to about 1300° C. The activation anneal may be performed in-situ and/or in a separate annealing chamber. The activation anneal may be performed for at least about 30 seconds or more, depending on the anneal temperature. For example, a rapid thermal anneal (RTA) at about 1300° C. may be performed for about 30 seconds, while a furnace anneal at about 1000° C. may be performed for about 30 minutes. The particular selection of activation times and temperatures may vary depending on the type of materials involved and the particular implant conditions employed. In particular embodiments, the anneal time may be in the range of about 30 seconds to about 30 minutes.

Figure 1D:
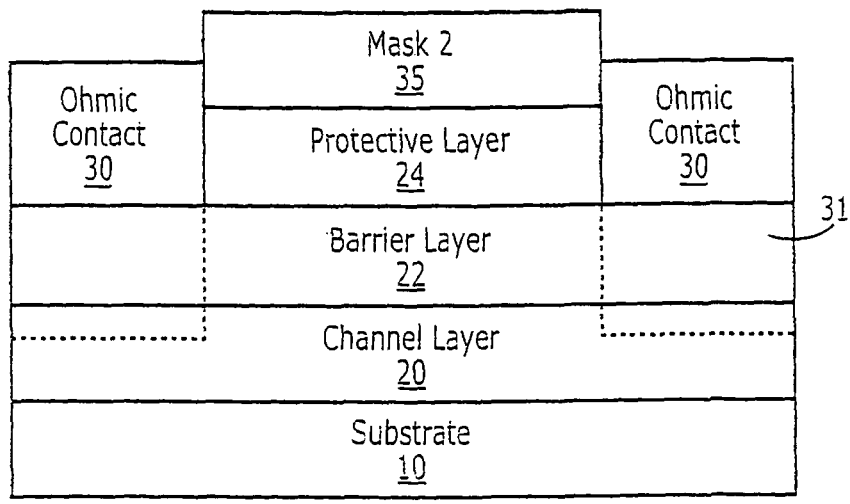

As illustrated in FIG. 1D, a second mask 35 is formed on the protective layer, and windows are then opened in the protective layer 24 for the formation of ohmic contacts 30. The windows may be formed utilizing a low damage etch with respect to the barrier layer 22 to expose the underlying barrier layer 22. Examples of low damage etch techniques include etching techniques other than reactive ion etching, such as inductively coupled plasma or electron cyclotron resonance (ECR) or downstream plasma etching with no DC component to the plasma. For an $SiO_2$ protective layer 24, a low damage etch could be a wet etch with buffered hydrofluoric acid. A selective etch of SiN and/or $SiO_2$ to an etch stop layer, followed by a low damage removal of the etch stop layer could also be performed. For SiN, $SiO_2$ may be used as an etch stop layer. In such embodiments, the protective layer 24 may include the SiN and/or $SiO_2$ layer as well as the etch stop layer. Thus, in certain embodiments of the present invention, the protective layer 24 may include multiple layers.

Metal may then be deposited, for example by evaporation, in the windows to provide the ohmic contacts 30. Suitable metals may include Ti, Si, Ni, Au, Al, Ta, Mo, TiN, WSiN, and/or Pt. If it is desired to anneal the deposited metal to form ohmic contacts, a separate lithography step may be performed such that the ohmic contacts 30 are patterned so as to be smaller than the window in the protective layer 24. The edges of the ohmic contacts 30 may thereby be spaced apart from the protective layer 24. For example, the edges of the ohmic contacts 30 may be spaced apart from the protective layer 24 by a distance in the range of about 0.1 to about 0.2 μm. The ohmic contacts 30 may be spaced apart from the protective layer 24 a distance sufficiently large to allow for misalignment tolerances in the formation and patterning of the ohmic contact metal. If the ohmic contact metal contacts the protective layer 24, the metal may diffuse into the protective layer 24 during subsequent heating steps which may result in a short between a gate contact and the ohmic contact(s) 30. However, the gap between the ohmic contacts 30 and the protective layer 24 should not be so large as to defeat the protective purpose of the protective layer 24 and, thereby, substantially degrade the performance of the device but should not be so small to risk random contact of ohmic material to the protective layer. Thus, for example, in certain embodiments of the present invention, the gap may be from about 0.1 μm to about 0.5 μm.

In some embodiments, the deposited metal may be annealed to provide the ohmic contacts 30. The anneal may be a high temperature anneal. For example, the anneal may be an anneal at a temperature of greater than about 900° C. in an atmosphere of an inert gas such as $N_2$ or Ar. Through the use of an ohmic contact anneal, the resistance of the ohmic contacts may be reduced from a relatively high resistance to about 1 Ω-mm or less. Thus, as used herein, the term "ohmic contact" refers to a non-rectifying contact that has a contact resistance of about 1 Ω-mm or less. As with the implant activation anneal, the presence of the protective layer 24 during the high temperature process steps may inhibit damage to the barrier layer 22 that may otherwise be caused by such steps. Thus, for example, the sheet resistance of the gate region 21 after the high temperature ohmic contact anneal may be substantially the same as the sheet resistance of the gate region 21 as-grown (i.e. before the contact anneal).

It will be appreciated, however, that due to the presence of the implanted regions 31 as provided above, it may not be necessary to anneal the deposited metal in order to form an ohmic contact thereto. That is, the metal may be ohmic as deposited, Since a contact anneal may not be required, it may be acceptable for the metal of the ohmic contacts 30 to contact the protective layer 24. Thus, in some embodiments of the invention, a lithography step that may otherwise be required in order to ensure that the ohmic contacts 30 are spaced away from the protective layer 24 may be avoided as a result of the implantation of impurities into the barrier layer 22.

In addition, since the ohmic contacts 30 are formed on the implanted regions 31, the ohmic contacts may have a lower resistivity than ohmic contacts formed on non-implanted regions. Thus, the on-resistance of devices formed according to some embodiments of the invention may be lowered.

The formation of improved ohmic contacts in GaN HEMTs may help improve the performance of power amplifiers at mm-wave frequencies, as well as other applications that require low on-resistance, including, for example, RF power switches, limiters, and cascode cells. For typical transistor applications, reducing the contact resistance of the device may permit an increase in the drain-source spacing without increasing the on-resistance of the device.

Figure 1E:
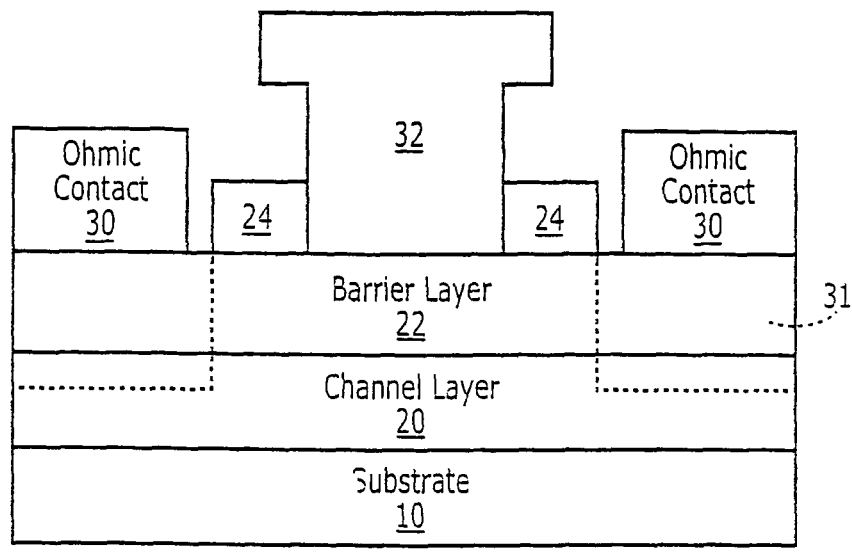

FIG. 1E illustrates the formation of a gate contact 32. A mask (not shown) is formed on the ohmic contacts and the protective layer 24 and patterned to form a window that exposes a portion of the protective layer 24. A recess is then formed through the protective layer 24 to expose a portion of the barrier layer 22. The recess is formed using a low damage etch process as described above. In particular embodiments where the ohmic contacts 30 provide source and drain contacts, the recess may be offset between the source and drain contacts such that the recess, and subsequently the gate contact 32, is closer to the source contact than the drain contact.

As seen in FIG. 1E, a gate contact 32 is formed in the recess and contacts the exposed portion of the barrier layer 22. The gate contact may be a "T" gate as illustrated in FIG. 1E and may be fabricated using conventional fabrication techniques. Suitable gate materials may depend on the composition of the barrier layer, however, in certain embodiments, conventional materials capable of making a Schottky contact to a nitride based semiconductor material may be used, such as Ni, Pt, NiSi$_x$, Cu, Pd, Cr, W and/or WSiN. Although it may be undesirable, it is possible that a small gap between the protective layer 24 and the gate contact 32 may arise as a result of, for example, anisotropy of the low-damage etch, resulting in an exposed surface of the barrier layer 22 between the protective layer 24 and the gate contact 32.

In some embodiments, since the source/drain contacts may not need to be annealed, it may be possible to form the source and drain contacts using the same metal in a single metallization step. For example, Ti, Si, Ni, Au, Al, Ta, Mo, TiN, WSiN, and/or Pt may form an ohmic contact as-deposited on the doped regions 31 of the barrier layer 22 while forming a non-ohmic contact on other portions of the barrier layer 22.

Figure 1F:
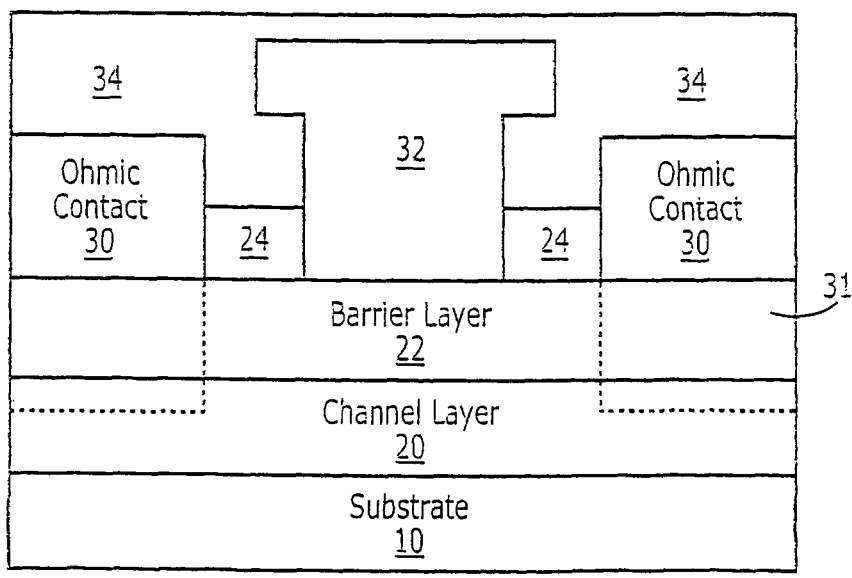

FIG. 1F illustrates the formation of a passivation layer 34. The passivation layer may be blanket deposited on the structure of FIG. 1E. In particular embodiments, the passivation layer 34 is deposited so as to substantially fill a gap between the protective layer 24 and the ohmic contacts 30 and also a gap between the protective layer 24 and the gate contact 32, if such gap(s) exist. In certain embodiments of the present invention, the passivation layer 34 may be silicon nitride, aluminum nitride, silicon dioxide and/or an oxynitride. Furthermore, the passivation layer 34 may be a single or multiple layers of uniform and/or non-uniform composition.

Figure 2:
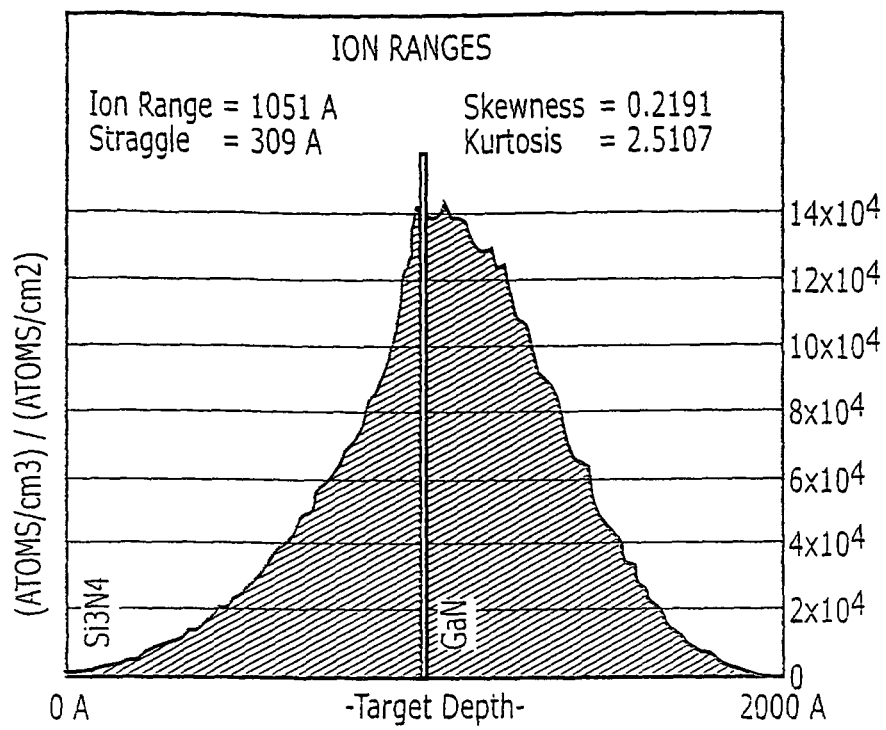
FIGS. 2 and 3 are plots of Monte Carlo simulation results for the implantation of silicon into silicon nitride/aluminum gallium nitride structures.

FIG. 2 is a plot of Monte Carlo simulation results for a possible impurity profile for silicon ions implanted into a structure including 100 nm of SiN on GaN. The simulation results are based on an implantation energy of 120 keV, which results in a peak concentration near the SiN/GaN interface. According to the simulation, a dose of about $3.4 \times 10^{14}$ ions/cm$^2$ would result in a peak concentration of $5 \times 10^{19}$ cm$^{-3}$ near the SiN/GaN interface.

Figure 3:
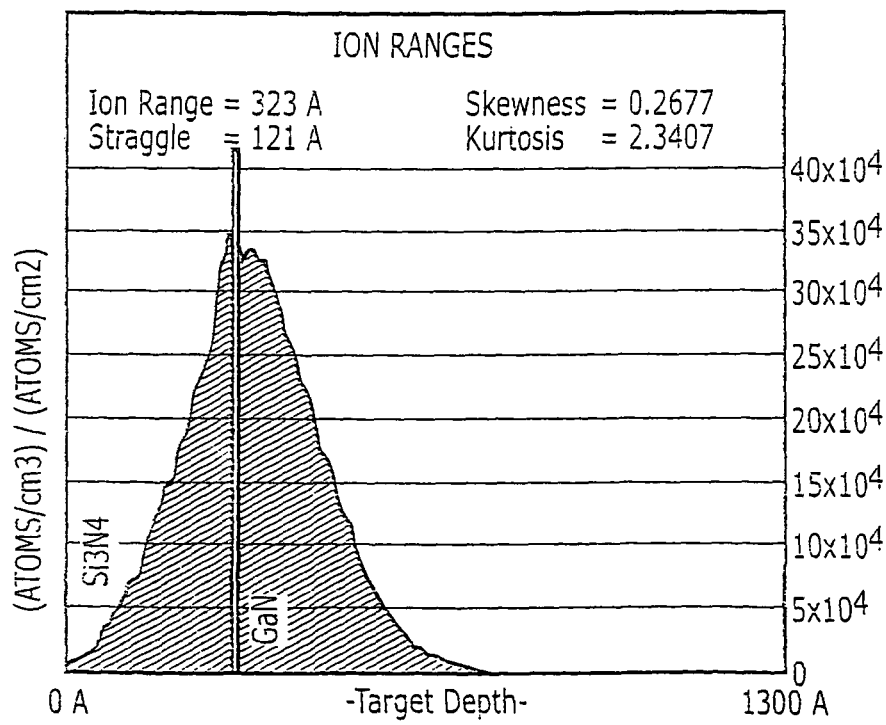

FIG. 3 is a plot of Monte Carlo simulation results for a possible impurity profile for silicon ions implanted into a structure including 30 nm of SiN on GaN. According to the simulation results, an implantation energy of 35 keV results in a peak concentration near the SiN/GaN interface. According to the simulation, for a peak concentration of $5 \times 10^{19}$ cm$^{-3}$, a dose of about $1.5 \times 10^{14}$ ions/cm$^2$ would be acceptable.

The best combination of energy/dose may depend on the activation anneal that is used, which may be optimized for a given structure. However, it is presently believed that implant dose may have a greater effect on the resulting structure than anneal temperature. The implant dose may be about $4 \times 10^{14}$ ions/cm$^2$ or greater. In some embodiments, the implant dose may be greater than about $2 \times 10^{15}$ ions/cm$^2$. The peak implant concentration may be greater than about $1 \times 10^{20}$ cm$^{-3}$. In some cases, the peak implant concentration may be greater than about $3 \times 10^{20}$ cm$^{-3}$. Based on simulation results, a dose of $2.4 \times 10^{15}$ ions/cm$^2$ implanted at 130 keV would result in a peak volumetric concentration of about $3.4 \times 10^{20}$ cm$^{-3}$, which may be desirable for some applications. The dose should be at least about $4 \times 10^{14}$/cm$^2$, but higher doses may be preferred because it may lead to good activation at lower anneal temperatures.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein. In some embodiments, insulating layers such as SiN, or relatively high quality AlN may be deposited for making a MISHEMT and/or passivating the surface. The additional layers may also include a compositionally graded transition layer or layers.

Furthermore, the barrier layer 22 may also be provided with multiple layers as described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In the drawings and specification, there have been disclosed typical embodiments of the invention, and, although specific terms have been employed, they have been used in a generic and descriptive sense only and not for purposes of limitation.

That which is claimed is:

1. A semiconductor structure comprising:
   a Group III-nitride semiconductor layer;
   a dielectric protective layer on the Group III-nitride semiconductor layer, the dielectric protective layer having at least one window therein exposing a portion of the Group III-nitride semiconductor layer;
   an ohmic contact extending through the window in the dielectric protective layer to contact the Group III-nitride semiconductor layer; and
   a distribution of implanted silicon dopants within the Group III-nitride semiconductor layer, wherein the distribution of implanted silicon dopants has a peak concentration at an interface of the Group III-nitride semiconductor layer and the ohmic contact.

2. The semiconductor structure of claim 1, wherein the dielectric protective layer comprises high purity SiN that has a concentration of hydrogen less than $2 \times 10^{21}$ cm$^{-3}$ and/or a concentration of oxygen less than $3 \times 10^{18}$ cm$^{-3}$ as measured by secondary ion mass spectrometry using a Cs ion beam.

3. The semiconductor structure of claim 1, wherein the distribution of implanted silicon dopants has a peak implant concentration of about $1 \times 10^{18}$ cm$^{-3}$ or greater.

4. The semiconductor structure of claim 3, wherein the distribution of implanted dopants has a peak implant concentration of about $5 \times 10^{19}$ cm$^{-3}$.

5. The semiconductor structure of claim 1, wherein the ohmic contact is in direct contact with the dielectric protective layer.

6. The semiconductor structure of claim 1, wherein the dielectric protective layer comprises SiN, the structure further comprising:
 a gap between the ohmic contact and the dielectric protective layer; and
 a passivation layer comprising a material different from the dielectric protective layer in the gap.

7. The semiconductor structure of claim 1, further comprising:
 a non-ohmic metal contact extending through the dielectric protective layer to the Group III-nitride semiconductor layer, wherein the non-ohmic metal contact consists of the same material as the ohmic contact.

8. The semiconductor structure of claim 1, further comprising:
 a non-ohmic metal contact extending through the dielectric protective layer to the Group III-nitride semiconductor layer, wherein the non-ohmic metal contact comprises a T-gate contact.

9. The semiconductor structure of claim 1, wherein the distribution of implanted silicon dopants decreases with distance from the interface of the Group III-nitride semiconductor layer and the dielectric protective layer.

10. The semiconductor structure according to claim 1, further comprising a barrier layer between the Group III-nitride semiconductor layer and the dielectric protective layer.

11. The semiconductor structure according to claim 10, wherein the barrier layer comprises at least one of AlN, AlInN, AlGaN and AlInGaN.

12. A transistor device comprising:
 a Group III-nitride semiconductor layer including source and drain regions;
 a SiN protective layer on the Group III-nitride semiconductor layer;
 source and drain ohmic contacts extending through the SiN protective layer to contact the source and drain regions, respectively, of the Group III-nitride semiconductor layer; and
 a distribution of implanted silicon dopants within the source and drain regions of the Group III-nitride semiconductor layer, wherein the distribution of implanted silicon dopants has a peak concentration at an interface of the Group III-nitride semiconductor layer and the source and drain ohmic contacts.

13. The transistor device of claim 12, further comprising:
 a non-ohmic metal contact extending through the SiN protective layer to the Group III-nitride semiconductor layer, wherein the non-ohmic metal contact comprises a T-gate contact to the Group III-nitride semiconductor layer.

14. The transistor device of claim 12, wherein the SiN protective layer comprises high purity SiN that has a concentration of hydrogen less than $2 \times 10^{21}$ cm$^{-3}$ and/or a concentration of oxygen less than $3 \times 10^{18}$ cm$^{-3}$ as measured by secondary ion mass spectrometry using a Cs ion beam.

15. The transistor device of claim 12, further comprising:
 a non-ohmic metal contact extending through the SiN protective layer to the Group III-nitride semiconductor layer, wherein the non-ohmic metal contact consists of the same material as one of the source and drain ohmic contacts.

16. The transistor device of claim 12, wherein the distribution of implanted silicon dopants has a peak implant concentration greater than $1 \times 10^{18}$ cm$^{-3}$.

17. The transistor device of claim 16, wherein the distribution of implanted silicon dopants has a peak implant concentration of about $5 \times 10^{19}$ cm$^{-3}$.

18. The transistor device of claim 12, wherein the distribution of implanted silicon dopants has a peak implant concentration greater than about $1 \times 10^{20}$ cm$^{-3}$.

19. The transistor device of claim 12, wherein the distribution of implanted silicon dopants has a peak implant concentration greater than about $3 \times 10^{20}$ cm$^{-3}$.

20. The transistor device of claim 12, wherein the distribution of implanted silicon dopants decreases with distance from the interface of the Group III-nitride semiconductor layer and the SiN protective layer.

21. A semiconductor structure comprising:
 a Group III-nitride semiconductor layer;
 a dielectric protective layer on the Group III-nitride semiconductor layer, the dielectric protective layer having at least one window therein exposing a portion of the Group III-nitride semiconductor layer;
 an ohmic contact extending through the window in the dielectric protective layer to contact the Group III-nitride semiconductor layer; and
 a distribution of implanted silicon dopants within the Group III-nitride semiconductor layer, wherein the distribution of implanted silicon dopants has a peak concentration of $1 \times 10^{18}$ cm$^{-3}$ or greater at an interface of the Group III-nitride semiconductor layer and the ohmic contact.

22. The semiconductor structure of claim 21, further comprising:
 a non-ohmic metal contact extending through the dielectric protective layer to the Group III-nitride semiconductor layer, wherein the non-ohmic metal contact consists of the same metal as the ohmic contact.

23. The semiconductor structure of claim 21, further comprising:
 a non-ohmic metal contact extending through the dielectric protective layer to the Group III-nitride semiconductor layer, wherein the non-ohmic metal contact comprises a T-gate contact.

24. The semiconductor structure of claim 21, wherein the distribution of implanted silicon dopants has a peak implant concentration greater than about $1 \times 10^{20}$ cm$^{-3}$.

25. The semiconductor structure of claim 21, wherein the distribution of implanted silicon dopants has a peak implant concentration greater than about $3 \times 10^{20}$ cm$^{-3}$.

26. The semiconductor structure of claim 21, wherein the distribution of implanted silicon dopants decreases with distance from the interface of the Group III-nitride semiconductor layer and the dielectric protective layer.

* * * * *